(12) United States Patent
Lee et al.

(10) Patent No.: US 11,804,386 B2
(45) Date of Patent: Oct. 31, 2023

(54) TRANSFER UNIT, AND APPARATUS AND METHOD FOR TREATING SUBSTRATE

(71) Applicant: SEMES CO., LTD., Chungcheongnam-do (KR)

(72) Inventors: Young Hun Lee, Chungcheongnam-do (KR); Jae Myoung Lee, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/244,722

(22) Filed: Apr. 29, 2021

(65) Prior Publication Data

US 2021/0249278 A1    Aug. 12, 2021

Related U.S. Application Data

(63) Continuation of application No. 15/607,356, filed on May 26, 2017, now Pat. No. 11,024,517.

(30) Foreign Application Priority Data

May 27, 2016 (KR) .......................... 10-2016-0065848

(51) Int. Cl.
*H01L 21/06* (2006.01)
*H01L 21/677* (2006.01)
(Continued)

(52) U.S. Cl.
CPC ...... *H01L 21/6704* (2013.01); *H01L 21/6719* (2013.01); *H01L 21/67023* (2013.01); *H01L 21/67051* (2013.01); *H01L 21/67253* (2013.01); *H01L 21/67703* (2013.01); *H01L 21/67742* (2013.01); *H01L 21/67781* (2013.01); *H01L 21/68707* (2013.01); *H01L 21/68764* (2013.01)

(58) Field of Classification Search
CPC ......... H01L 21/67023; H01L 21/67253; H01L 21/67703; H01L 21/68707
See application file for complete search history.

(56) References Cited

U.S. PATENT DOCUMENTS 5,321,634 A    6/1994 Obata et al.
5,625,170 A    4/1997 Poris
(Continued)

FOREIGN PATENT DOCUMENTS

CN    102157424 A    8/2011
CN    102856234 A    1/2013
(Continued)

*Primary Examiner* — Natasha N Campbell
(74) *Attorney, Agent, or Firm* — Procopio, Cory, Hargreaves & Savitch LLP

(57) ABSTRACT

Disclosed are an apparatus and a method for liquid-treating a substrate. An apparatus for treating a substrate includes a liquid treatment chamber that supplies a liquid onto the substrate to liquid-treat the substrate, a drying chamber that removes the remained liquid on the substrate, and a transfer unit that transfers the substrate between the liquid treatment chamber and the drying chamber, wherein the transfer unit includes a hand that supports the substrate, and a weight measuring unit that measures a weight of the remained liquid on the substrate. A weight of a remained liquid on a substrate may be measured by measuring a weight of the substrate while the substrate is transferred.

13 Claims, 11 Drawing Sheets

(51) Int. Cl.
*H01L 21/687* (2006.01)
*H01L 21/67* (2006.01)

(56) References Cited

U.S. PATENT DOCUMENTS

| | | |
|---|---|---|
| 6,113,165 A | 9/2000 | Wen et al. |
| 6,221,171 B1* | 4/2001 | Maekawa ......... H01L 21/67051 |
| | | 134/32 |
| 2002/0160625 A1* | 10/2002 | Inoue ................ H01L 21/02052 |
| | | 257/E21.228 |
| 2004/0040659 A1 | 3/2004 | Hasper |
| 2004/0050406 A1 | 3/2004 | Sehgal |
| 2005/0199078 A1 | 9/2005 | Temmler et al. |
| 2007/0128008 A1 | 6/2007 | Morikawa |
| 2009/0092470 A1 | 4/2009 | Bonora |
| 2012/0304485 A1* | 12/2012 | Hayashi ............ H01L 21/02057 |
| | | 257/E21.328 |
| 2013/0284209 A1 | 10/2013 | Kim et al. |
| 2015/0219486 A1 | 8/2015 | Fenske et al. |

FOREIGN PATENT DOCUMENTS

| | | |
|---|---|---|
| CN | 103377971 A | 10/2013 |
| CN | 103456665 A | 12/2013 |
| CN | 104332430 A | 2/2015 |
| JP | 2000-012430 A | 1/2000 |
| KR | 10-2004-0063301 A | 7/2004 |
| KR | 10-2005-0099670 A | 10/2005 |
| KR | 10-2006-0085590 A | 7/2006 |
| KR | 10-2007-0044513 A | 4/2007 |
| KR | 10-2010-0079467 A | 7/2010 |
| KR | 1020150051110 A | 5/2015 |
| KR | 10-2015-0077536 A | 7/2015 |

\* cited by examiner

TRANSFER UNIT, AND APPARATUS AND METHOD FOR TREATING SUBSTRATE

CROSS-REFERENCE TO RELATED APPLICATIONS

This application is a Continuation of U.S. patent application Ser. No. 15/607,356, filed on May 26, 2017, which a claim for priority under 35 U.S.C. § 119 is made to Korean Patent Application No. 10-2016-0065848 filed May 27, 2016, in the Korean Intellectual Property Office, the entire contents of which are hereby incorporated by reference.

BACKGROUND

The inventive concept relates to an apparatus and a method for treating a substrate, and more particularly, to an apparatus and a method for liquid-treating a substrate.

In order to manufacture a semiconductor device, a desired pattern is formed on a substrate through various processes such as, photographing, etching, ashing, ion injection, and deposition of thin films. Various treatment liquid are used in the processes, and contaminants and particles are generated during the process. In order to solve this, a cleaning process for cleaning contaminants and particles is performed before and after the process.

In general, the cleaning process includes a liquid treating process and a drying process. In the liquid treating process, a treatment liquid is supplied onto the substrate, and in the drying process, the remained liquid on the substrate is removed. The liquid treating process includes a chemical treating operation, a rinsing operation, and a solvent substituting operation. In the chemical treating operation, foreign substances are removed from the substrate with a chemical, and in the rinsing operation, the chemical residing on the substrate is removed. In the solvent substituting operation, the rinsing remained liquid on the substrate is substituted by an organic solvent.

In general, the chemical treating operation, the rinsing operation, and the solvent substituting operation are performed in a liquid treatment chamber, and the drying operation is performed in a drying chamber. Accordingly, the substrate, on which the solvent substituting operation has been completely performed, is transferred to the drying chamber.

The organic solvent residing on the substrate is a volatile material and may be volatilized while the substrate is transferred.

Accordingly, when the amount of the organic solvent residing on the substrate is smaller than a preset range, a pattern leaning phenomenon may be caused and a process defect may occur. Unlike this, when the amount of residing organic solvent is greater than the preset range, the organic solvent may be applied as a particle, contaminating peripheral devices.

SUMMARY

The inventive concept provides an apparatus and a method for measuring a weight of a remained liquid on a substrate.

The inventive concept also provides an apparatus and a method for measuring a weight of a remained liquid while a substrate is transferred.

The inventive concept also provides an apparatus and a method for preventing an amount of a remained liquid on a substrate from deviating from a preset range, causing a process defect.

The inventive concept provides an apparatus and a method for liquid-treating a substrate. In accordance with an aspect of the inventive concept, there is provided an apparatus for treating a substrate, the apparatus including a liquid treatment chamber that supplies a liquid onto the substrate to liquid-treat the substrate, a drying chamber that removes the remained liquid on the substrate, and a transfer unit that transfers the substrate between the liquid treatment chamber and the drying chamber, wherein the transfer unit includes a hand that supports the substrate, and a weight measuring unit that measures a weight of the remained liquid on the substrate.

The apparatus may further include a controller that controls the transfer unit, and the controller may receive a pre-treatment weight of the substrate before the substrate is carried into the liquid treatment chamber and a post-treatment weight of the substrate liquid-treated by the liquid treatment chamber, and may calculate a weight of the remained liquid on the substrate based on a difference between the pre-treatment weight and the post-treatment weight.

The apparatus may further include a controller that controls the transfer unit, the controller may receive a post-treatment weight of the substrate liquid-treated in the liquid treatment chamber, the post-treatment weight of the liquid-treated substrate may further include a pre-transfer weight that is measured shortly before or immediately after the transfer unit carries the substrate out of the liquid treatment chamber, and a post-transfer weight of the substrate that is measured shortly before the substrate is carried into the drying chamber, and the controller may calculate an amount of lost liquid while the substrate is transferred, based on a difference between the pre-transfer weight and the post-transfer weight.

The controller may control the transfer unit to, if the difference deviates from a preset value, carry the substrate into the liquid treatment chamber again to liquid-treat the substrate.

If the difference deviates from the preset value, the controller may generate an interlock.

The weight measuring unit may include a load cell that is mounted on the hand to measure a weight of the substrate, on which the liquid resides.

In accordance with an aspect of the inventive concept, there is provided a method for treating a substrate, the method including liquid-treating the substrate in a liquid treatment chamber, drying the substrate in a drying chamber, and transferring the substrate from the liquid treatment chamber to the drying chamber, wherein the transferring of the substrate includes measuring a weight of the remained liquid on the substrate.

The weight of the liquid may be measured by a transfer unit that transfers the substrate from the liquid treatment chamber to the drying chamber. The method may further include before the liquid-treating of the substrate, carrying the substrate into the liquid treatment chamber by the transfer unit, the carrying of the substrate may include measuring a pre-treatment weight of the substrate before the substrate is carried into the liquid treatment chamber, the transferring of the substrate may include measuring a post-treatment weight of the substrate liquid-treated in the liquid treatment chamber, and a weight of the remained liquid may be calculated based on a difference between the pre-treatment weight and the post-treatment weight.

The transferring of the substrate may include measuring a pre-transfer weight of the substrate shortly before or immediately after the substrate is carried out of the liquid treatment chamber, measuring a post-transfer weight of the substrate shortly before the substrate is carried into the drying chamber, and calculating an amount of lost remained liquid on the substrate based on a difference between the pre-transfer weight and the post-transfer weight.

If the difference deviates from a preset value, the substrate may be carried into the liquid treatment chamber again and is liquid-treated.

If the difference deviates from a preset value, a maintenance may be performed.

The liquid may include an isopropyl alcohol (IPA) liquid. The drying of the substrate may include performing a supercritical treatment process in the drying chamber.

The transfer unit may transfer the substrate from the liquid treatment chamber to the drying chamber while the substrate is supported horizontally.

The weight of the liquid may be measured by a load cell provided in a hand of the transfer unit.

The weight of the liquid may be measured by a buffer unit that temporarily preserves the substrate.

In accordance with another embodiment of the inventive concept, there is provided a unit for transferring a substrate, the unit including a movable hand that supports the substrate in a horizontal state, and a weight measuring unit that measures a weight of a remained liquid on the substrate positioned on the hand.

The weight measuring unit may include a load cell that is mounted on the hand to measure a weight of the substrate, on which the liquid resides.

In accordance with another aspect of the inventive concept, there is provided a method for treating a substrate, the method including liquid-treating the substrate in a liquid treatment chamber, and measuring a weight of the substrate after liquid-treating the substrate, wherein the measuring of the weight includes measuring a weight of the remained liquid on the substrate.

The measuring of the weight may include measuring a pre-treatment weight of the substrate before the substrate is liquid-treated, measuring a post-treatment weight of the substrate after the substrate is treated, and calculating a weight of the remained liquid based on a difference between the pre-treatment weight and the post-treatment weight. The weight of the remained liquid may be measured by a transfer unit that carries the substrate from the liquid treatment chamber. The weight of the remained liquid may be measured by a buffer chamber that temporarily preserves the substrate.

In accordance with another aspect of the inventive concept, there is provided an apparatus for treating a substrate, the apparatus including a first process chamber that primarily treats the substrate, a second process chamber that secondarily treats the substrate, and a transfer unit that transfers the substrate between the first process chamber and the second process chamber, wherein the transfer unit includes a hand that supports the substrate, and a weight measuring unit that measures a weight of the substrate.

The apparatus may further include a controller that controls the transfer unit, and the controller may receive a pre-treatment weight of the substrate before the substrate is carried into the first process chamber and a post-treatment weight of the substrate primarily treated by the first process chamber, and may calculate the remained liquid on the substrate based on a difference between the pre-treatment weight and the post-treatment weight.

The apparatus may further include a controller that controls the transfer unit, the controller may receive a post-treatment weight of the substrate primarily treated in the first process chamber, and wherein the post-treatment weight of the primarily-treated substrate further includes a pre-transfer weight that is measured shortly before or immediately after the transfer unit carries the substrate out of the first process chamber, and a post-transfer weight of the substrate that is measured shortly before the substrate is carried into the second process chamber, and wherein the controller calculates an amount of lost liquid while the substrate is transferred, based on a difference between the pre-transfer weight and the post-transfer weight.

In accordance with another aspect of the inventive concept, there is provided a method for treating a substrate, the method including primarily treating the substrate in a first process chamber, secondarily treating the substrate in a second process chamber, and transferring the substrate from the first process chamber to the second process chamber, and wherein the transferring of the substrate includes measuring a weight of the remained liquid on the substrate.

The weight of the liquid is measured by a transfer unit that transfers the substrate from the first process chamber to the second process chamber.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
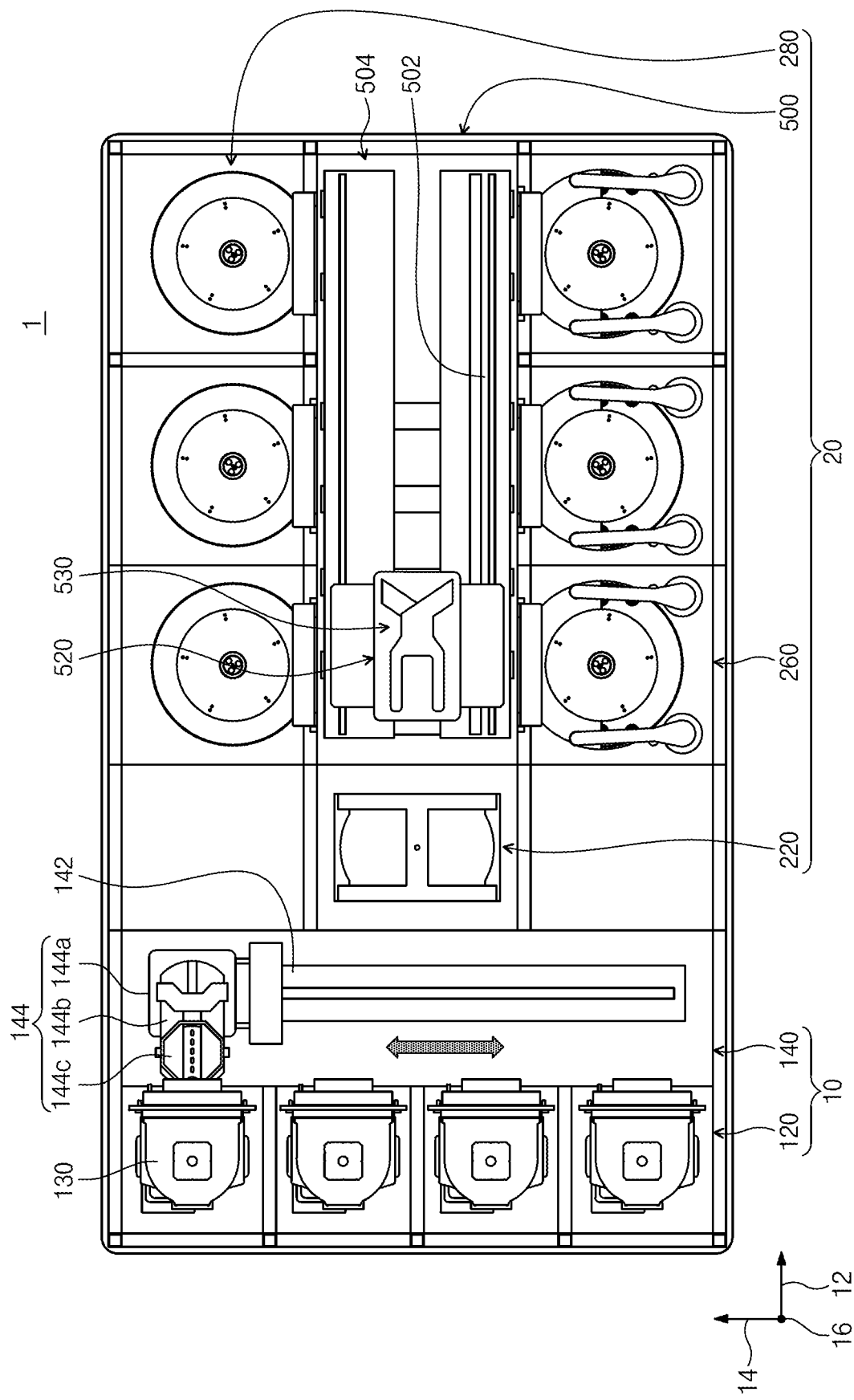
FIG. 1 is a plan view illustrating a substrate treating system according to a first embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

An embodiment of the inventive concept will be described with reference to FIGS. 1 to 13.

FIG. 1 is a plan view illustrating a substrate treating system according to a first embodiment of the inventive concept.

Referring to FIG. 1, the substrate treating system 1 has an index module 10 and a process treating module 20, and the index module 100 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 130, in which a substrate W is received, is seated on the load ports 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 20 or a footprint. A plurality of slots (not illustrated) provided to support peripheries of substrates are formed in the carrier 130. A plurality of slots are provided along the third direction 16, and the substrate is situated in the carrier 130 such that the substrates are stacked to be spaced apart from each other along the third direction 16. A front opening unified pod (FOUP) may be used as the carrier 130.

The feeding frame 140 transports the substrates W between the carrier 130 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 130 in the process module 20, and some of the index arms 155 may be used when the substrates W are transported from the carrier 130 to the process treating module 20. This structure may prevent particles generated from the substrates W before the process treatment from being attached to the substrates W after the process treatment in the process of carrying the substrates W in and out by the index robot 144.

The process treating module 20 includes a buffer unit 220, a transfer unit 500, a first process chamber 260, a second process chamber 280, and a controller 600.

Figure 2:
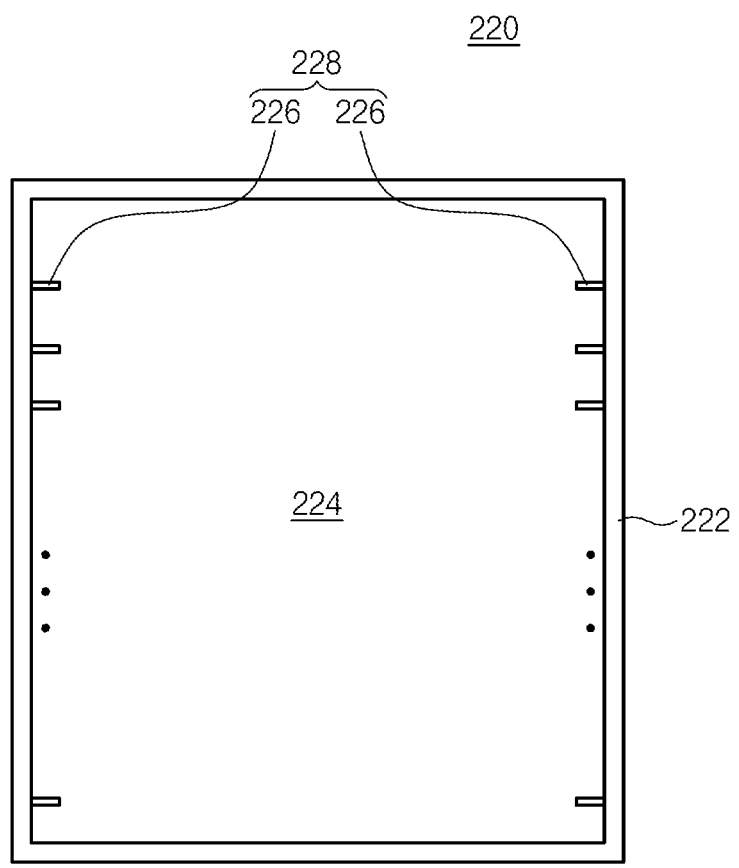
FIG. 2 is a sectional view illustrating a buffer unit of FIG. 1.

The buffer unit 220 is arranged between the feeding frame 140 and the transfer unit 500. The buffer unit 220 provides a space in which the substrates W stay before being transported, between the transfer unit 500 and the feeding frame 140. FIG. 2 is a sectional view illustrating a buffer unit of FIG. 1. Referring to FIG. 2, the buffer unit 220 includes a buffer chamber 222 and a slot member 228. The buffer chamber 222 has a hexahedral shape, opposite side surfaces of which are opened. The buffer chamber 222 has a buffer space 224 in which a substrate W is temporarily preserved. The opened side surfaces of the buffer chamber 222 function as entrances, through which the substrate W is carried in. One opened side surface of the buffer chamber 222 is a surface that faces the feeding frame 140, and the opposite opened side surface of the buffer chamber 222 is a surface that faces the transfer unit 500.

The slot member 228 supports the substrate W in the buffer space 224. A plurality of slot members 228 are provided to be spaced apart from each other vertically. The number of the slot members 228 may be the total number of the hands 541 or more. Each of the slot members 228 has a plurality of support slots 226 for receiving the substrate W while the substrate W being arranged in parallel to the ground surface. For example, the slot member 228 may include two facing support slots 226. The facing support slots 226 may be located on opposite inner surfaces of the buffer chamber 222. The slot members 222 (hereinafter, upper slot members) located in an upper area of the buffer space 224 may be spaced apart from each other by a first interval. The slot members 222 (hereinafter, lower slot members) located in a lower area of the buffer space 224 may be spaced apart from each other by a first interval. The lowermost support slot of the upper slot member and the uppermost slot member of the lower slot member may be spaced apart from each other by a second interval that is greater than the first interval. According to an embodiment, one of the upper slot member and the lower slot member is a slot member 228 for carrying the substrate W from the transfer unit 500 into the buffer space 224, and the other of the upper slot member and the lower slot member is a slot member 228 for carrying out the substrate W preserved in the buffer space 224 from the transfer unit 500.

The transfer unit 500 transfers the substrate W between any two of the buffer unit 220, the first process chambers 260, and the second process chambers 280. The transfer unit 500 includes a transfer chamber 504, a driving member 510, a transfer member 540, and a weight measuring unit 550. The transfer chamber 504 has a length that faces a first direction. A transfer space for transferring the substrate W is provided in the interior of the transfer chamber 504. A transfer rail 502 is installed in the transfer space. The transfer rain 502 has a lengthwise direction that is parallel to the transfer chamber 504.

The first process chambers 260 are arranged on one side of the transfer chamber 504 along a second direction 14, and the second process chambers 280 are arranged on an opposite side thereof. The first process chambers 260 and the second process chambers 280 may be arranged to be symmetrical to each other with respect to the transfer chamber 504. Some of the first process chambers 260 are arranged along the lengthwise direction of the transfer chamber 504. Furthermore, some of the first process chambers 260 are arranged to be stacked on each other. That is, the first process chambers 260 having an array of A by B (A and B are natural numbers) may be arranged on one side of the transfer chamber 504. Here, A is the number of the first process chambers 260 provided in a row along the first direction 12, and B is the number of the first process chambers 260 provided in a row along the third direction 16. When four or six first process chambers 260 are provided on one side of the transfer chamber 504, the first process chambers 260 may be arranged in an array of 2 by 2 or 3 by 2. The number of the first process chambers 260 may increase or decrease.

Similarly to the first process chambers 260, the second process chambers 280 may be arranged in an array of M by N (M and N are natural numbers). Here, M and N may be the same numbers as A and B. Unlike the above description, the first process chambers 260 and the second process chambers 280 may be provided only on one side of the transfer chamber 504. Further, unlike the above description, the first process chambers 260 and the second process chambers 280 may be provided on opposite sides of the transfer chamber 500 in a single layer. Further, unlike the above description, the first process chambers 260 and the second process chambers 280 may be provided in various arrangements.

Figure 3:
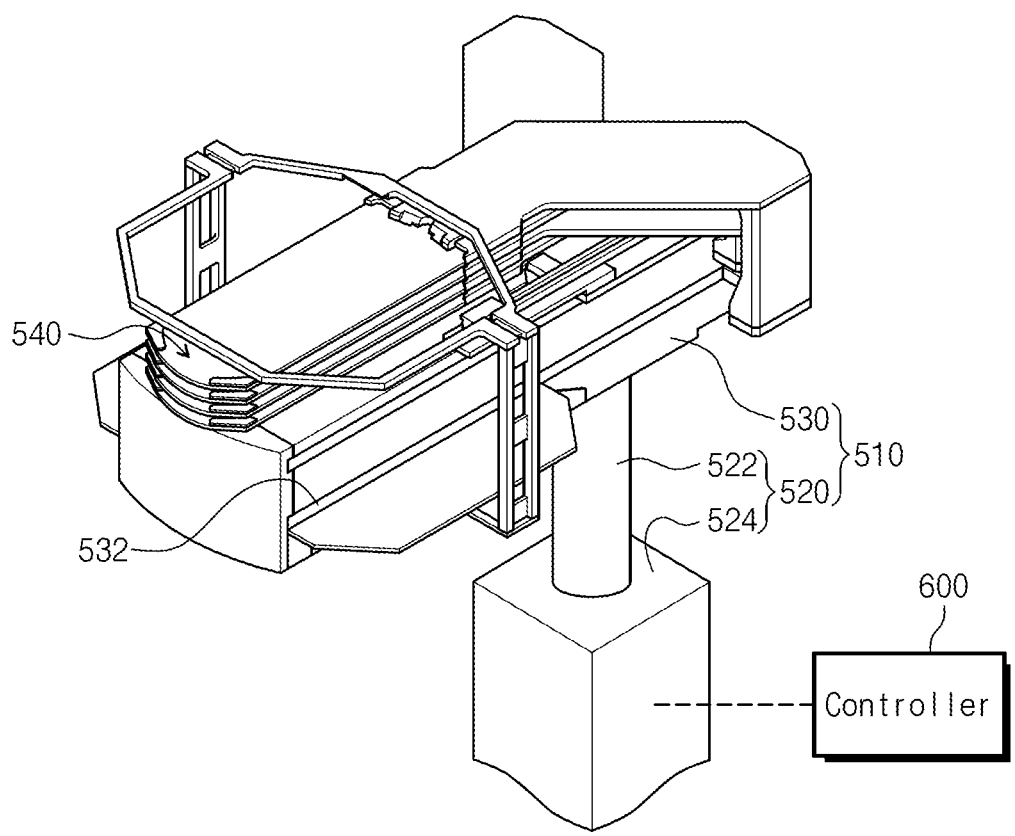
FIG. 3 is a perspective view illustrating a transfer unit of FIG. 1.
Figure 4:
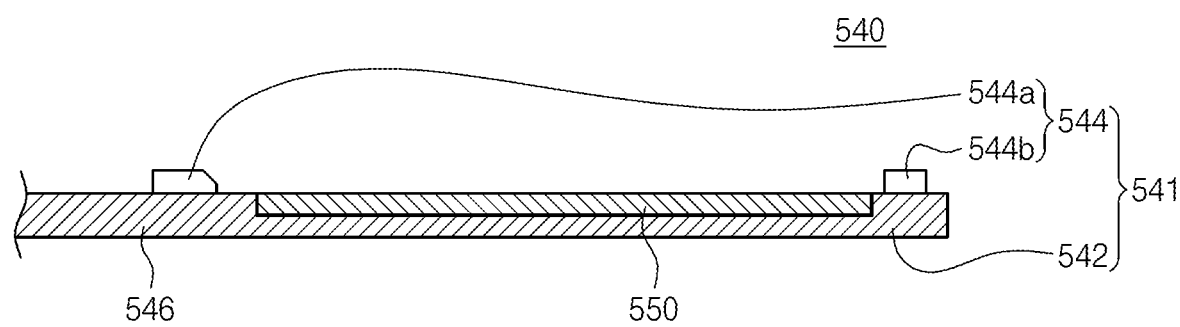
FIG. 4 is a sectional view illustrating a hand and a weight measuring unit of FIG. 3.

FIG. 3 is a perspective view illustrating a transfer unit of FIG. 1. FIG. 4 is a sectional view illustrating a hand and a weight measuring unit of FIG. 3. Referring to FIGS. 3 and 4, the driving member 510 vertically moves the transfer member 540 and rotates the transfer member 540 about a vertical axis. Further, the driving member 510 may linearly reciprocally move in a lengthwise direction of the transfer rail 502. The driving member 510 includes an elevation member 520 and a support body 530. The elevation member 520 includes a movable block 524 and an elevation shaft 522. The elevation shaft 522 connects the support body 530 and the movable block 524. The elevation shaft 522 is installed on an upper surface of the movable block 524. The elevation shaft 522 has a length that faces upward and downward directions. A length of the elevation shaft 522 may be adjusted vertically. Further, the elevation shaft 522 may be rotated about a central axis thereof.

The support body 530 is fixedly coupled to an upper end of the elevation shaft 522. The support body 530 may be moved vertically by the elevation member 520 and may be rotated about the vertical axis thereof. A guide rail 532 is installed on a side surface of the support body 530. A plurality of guide rails 532 are provided. Lengthwise directions of the guide rails 532 may be parallel to each other. The lengthwise direction of the guide rails 532 may be parallel to a direction that is parallel to the third direction 16. The guide rails 532 are provided at different heights of the support body 530. Different arms 546 are installed in the guide rails 532. For example, four guide rails 532 are provided, and two guide rails 532 may be provided on opposite sides of the support body 530, respectively. Driving motors (not illustrated) are installed in the guide rails 532, and the driving motors (not illustrated) may be independently controlled. Accordingly, the hands 541 of the transfer member 540 may be driven to extend in parallel to each other independently.

The transfer member 540 supports the substrate W. A plurality of transfer members 540 are provided. According to an embodiment, the number of the transfer members 540 may correspond to the number of the guide rails 532. Each of the transfer members 540 includes an arm 546 and a hand 541. The arm 546 has a bar shape that faces a horizontal direction. The arm 546 is installed in a guide rail, and may be horizontally moved along the lengthwise direction of the guide rail. The hand 541 is fixedly coupled to an end of the arm 546. The hand 541 has a seating part 542 and a guide part 544. The seating part 542 has a plate shape in which the substrate W is seated. The seating part 542 has a horizontal lengthwise direction. A bottom surface of the substrate W is seated on the seating part 542. The seating part 542 may support the substrate W in a horizontal state. For example, the seating part 542 may have a rectangular plate shape. The guide part 544 is located to protrude from a front end and a rear end of the seating part 542 upwards. The guide part 544 prevents the substrate W seated in the seating part 542 from being popped out by an impact. The guide part 544 supports a side of the substrate W.

The weight measuring unit 550 measures the weight of the substrate W seated on the hand 541. The weight measuring unit 550 is provided in the seating part 542. The weight measuring unit 550 delivers the measuring weight information to the controller 600. According to an embodiment, the weight measuring unit 550 may measure the weight of the substrate W while the driving member 510 and the transfer member 540 are stopped. This prevents the weight of the substrate W from being erroneously measured due to vibration of a robot. The weight measuring unit 550 may be a load cell that measures the weight of the substrate W. The weight measuring unit 550 may measure the weight of the substrate W by measuring a deflection of the substrate W.

The first process chamber 260 and the second process chamber 280 may sequentially perform a process on one substrate W. The first process chamber 260 may be provided as a liquid treating chamber that liquid-processes the substrate W, and the second process chamber 280 may be provided as a drying chamber that removes remained liquid on the substrate W. For example, the substrate W may perform a chemical process, a rinsing process, and a solvent substitution process in the first process chamber 260, and may perform a drying process in the second process chamber 260. In this case, the substitution process may be performed by an organic solvent, and the drying process may be performed by a supercritical fluid. An isopropyl alcohol (IPA) liquid may be used as an organic solvent, and carbon dioxide ($CO_2$) may be used as a supercritical fluid.

Figure 5:
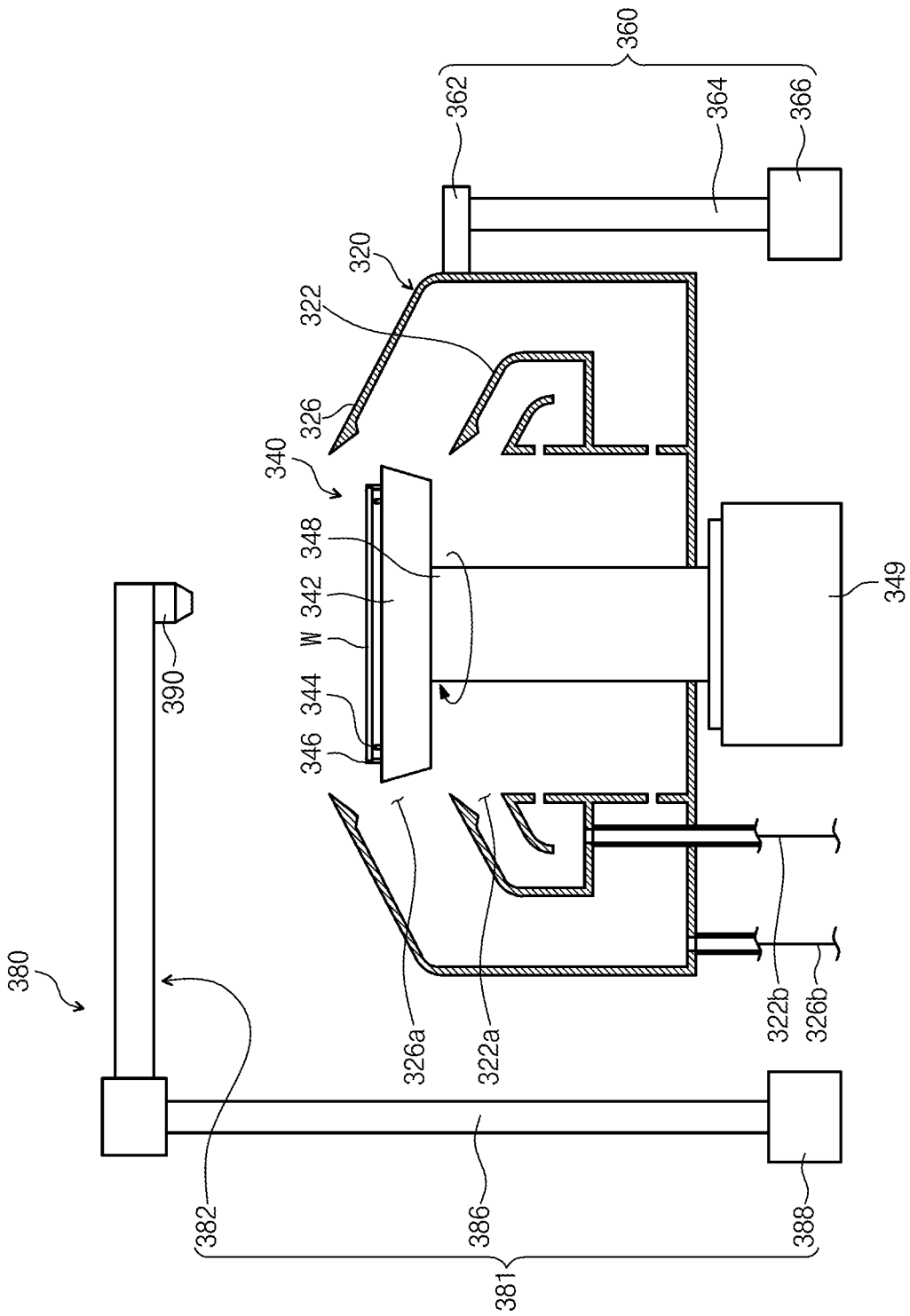
FIG. 5 is a sectional view illustrating an apparatus for cleaning a substrate in a first process chamber of FIG. 1.

Hereinafter, a liquid treating apparatus 300 provided in the first process chamber 260 will be described. FIG. 5 is a sectional view illustrating an apparatus for cleaning a substrate in a first process chamber of FIG. 1. Referring to FIG. 5, the liquid treating apparatus 300 includes a treatment container 320, a spin head 340, an elevation unit 360, and an ejection member 380. The treatment container 320 provides a space in which a liquid treatment process is performed, and an upper side of the treatment container 320 is opened. The treatment container 320 includes an inner recovery vessel 322 and an outer recovery vessel 326. The recovery vessels 322 and 326 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An inner space 322a of the inner recovery vessel 322 and a space between the outer recovery vessel 326 and the inner recovery vessel 322 function as inlets, through which the treatment liquid is introduced into the inner recovery vessel 322 and the outer recovery vessel 326, respectively. Recovery lines 322b and 326b extending from the recovery vessels 322 and 326 perpendicularly in the downward direction of the bottom surfaces thereof are connected to the recovery vessels 322 and 326, respectively. The recovery lines 322b and 326b discharge the treatment liquids introduced through the recovery vessels 322 and 326, respectively. The discharged treatment liquids may be reused through an external treatment liquid recycling system (not illustrated).

The spin head 340 is arranged in the treatment container 320. The spin head 340 is provided as a substrate support unit 340 that supports and rotates the substrate W during the process. The spin head 340 has a body 342, a plurality of support pins 334, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 334 are provided. The support pins 334 may be arranged to be spaced apart from each other at a periphery of the upper surface of the body 342 and protrude upwards from the body 342. The support pins 334 are arranged to have a generally annular ring shape through combination thereof. The support pins 334 support a periphery of a rear surface of the substrate such that the substrate W is spaced apart from the upper surface of the body 342 by a predetermined distance. A plurality of chuck pins 346 are provided. The chuck pins 346 are arranged to be more distant from the center of the body 342 than the support pins 334. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the container 320 upwards and downwards. When the container 320 is moved upwards and downwards, a relative height of the container 320 to the spin head 340 is changed. The elevation unit 360 has a bracket 362, a movable shaft 364, and a driver 366. The bracket 362 is fixedly installed on an outer wall of the container 320, and the movable shaft 364 that is moved upwards and downwards by the driver 366 is fixedly coupled to the bracket 362. The treatment container 320 is lowered such that, when the substrate W is positioned on the spin head 340 or is lifted from the spin head 340, the spin head 340 protrudes to the upper side of the treatment container 320. When the process is performed, the height of the container 320 is adjusted such that the treatment liquid is introduced into the preset recovery vessel 360 according to the kind of the treatment liquid supplied to the substrate W.

Unlike those described above, the elevation unit 360 may move the spin head 340, instead of the treatment container 320, upwards and downwards.

The ejection member 380 supplies the treatment liquid onto the substrate W. A plurality of ejection members 380 may be provided. The ejection members 380 may supply different kinds of treatment liquids. The injection member 380 has a nozzle support 382, a nozzle 384, a support shaft 386, and a driver 388. The lengthwise direction of the support shaft 386 is provided along the third direction 16, and the driver 388 is coupled to a lower end of the support shaft 386. The driver 388 rotates and elevates the support shaft 386. The nozzle support 382 is vertically coupled to an end opposite to an end of the support shaft 386 coupled to the driver 386. The nozzle 384 is installed on the bottom surface of an end of the nozzle support 382. The nozzle 384 is moved to a process location and a standby location by the driver 388. The process location is a location at which the nozzle 384 is arranged at a vertical upper portion of the treatment container 320, and the standby location is a location that deviates from the vertical upper portion of the treatment container 320. For example, the treatment liquid may include a chemical, a rinsing liquid, and an organic solvent. The chemical may be a liquid having a strong acid or alkali property. The rinsing liquid may be pure water. The organic solvent may be an isopropyl alcohol (IPA) liquid.

Figure 6:
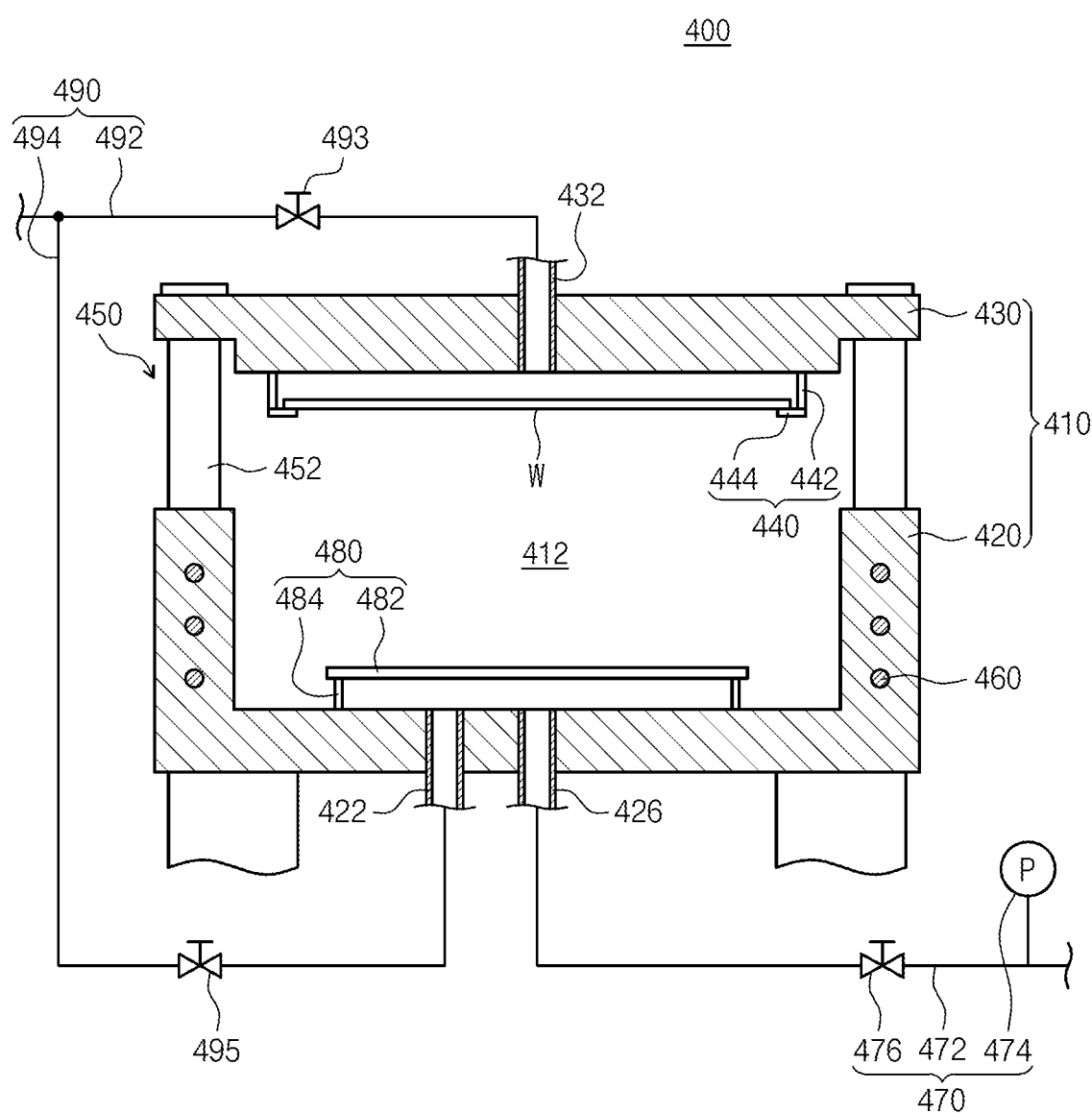
FIG. 6 is a sectional view illustrating an apparatus for drying a substrate in a second process chamber of FIG. 1.

A drying apparatus 400 for performing a substrate drying process is provided in the second process chamber. The drying apparatus 400 dries the treated substrate W substituted by an organic solvent by the liquid treating apparatus. The drying apparatus 400 dries the substrate W, on which the organic solvent resides. The drying apparatus 400 may dry the substrate W by using a supercritical solvent. FIG. 6 is a sectional view illustrating an apparatus for drying a substrate in a second process chamber of FIG. 1. Referring to FIG. 6, the drying apparatus 400 includes a high-pressure chamber 410, a substrate support unit 440, a body elevating member 450, a heating member 460, a blocking member 480, an exhaustion unit 470, and a fluid supply unit 490.

The high-pressure chamber 410 defines a treatment space 412 for treating the substrate W therein. The high-pressure chamber 410 closes the treatment space 412 from the outside while the substrate W is treated. The high-pressure chamber 410 includes a lower body 420 and an upper body 430. The lower body 420 has an open-topped cup shape. A lower supply port 422 and an exhaustion port 426 are formed on a bottom surface of an inside of the lower body 420. When viewed from the top, the lower supply port 422 may deviate from a central axis of the lower body 420. The lower supply port 422 functions as a passage, through which the supercritical fluid is supplied to the treatment space 412.

The upper body 430 is combined with the lower body 420 to define a treatment space 412 therebetween. The upper body 430 is located above the lower body 420. The upper body 430 has a tetragonal plate shape. An upper supply port 432 is formed in the upper body 430. The upper supply port 432 functions as a passage, through which the supercritical fluid is supplied to the treatment space 412. The upper supply port 432 may be located to coincide with the center of the upper body 430. A lower end of the upper body 430 may face an upper end of the lower body 420 at a location at which the central axis of the upper body 430 coincides with the central axis of the lower body 420. According to an example, the upper body 430 and the lower body 420 are formed of a metallic material.

Figure 7:
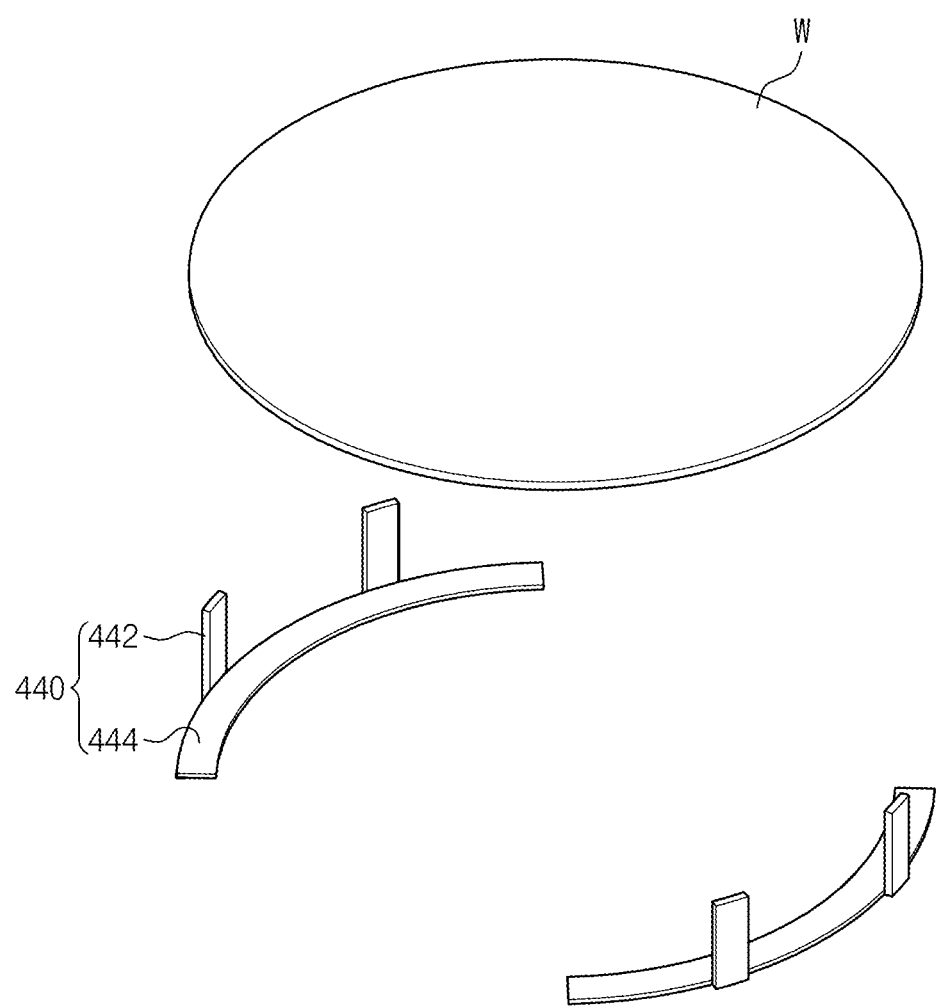
FIG. 7 is a perspective view illustrating a substrate support unit of FIG. 6.

The substrate supporting unit 440 supports the substrate W in the treatment space 412. FIG. 7 is a perspective view illustrating a substrate support unit of FIG. 6. Referring to FIG. 7, the substrate support unit 440 supports the substrate W such that a treatment surface of the substrate W faces the upper side. The substrate support unit 440 includes a support member 442 and a substrate maintaining member 444. The support 442 has a bar shape that extends downwards from a bottom surface of the upper body 430. A plurality of support members 442 are provided. For example, four support members 442 may be provided. The substrate maintaining member 444 supports a peripheral area of a bottom surface of the substrate W. A plurality of substrate maintaining members 444 are provided, and support different areas of the substrate W. For example, two substrate maintaining members 444 may be provided. When viewed from the top, the substrate maintaining member 444 has a rounded plate shape. When viewed from the top, the substrate maintaining member 444 is located inside the support member. The substrate maintaining members 444 are combined with each other to have a ring shape. The substrate maintaining members 444 are spaced apart from each other.

Referring back to FIG. 6, the body elevating member 450 adjusts a relative location between the upper body 430 and the lower body 420. The body elevating member 450 moves one of the upper body 430 and the lower body 420 upwards and downwards. It is described in the embodiment that a location of the upper body 430 is fixed and a distance between the upper body 430 and the lower body 420 is adjusted by moving the lower body 420. Optionally, the substrate support unit 440 installed in the fixed lower body 420, and the upper body 430 may be moved. The body elevating member 450 moves the lower body 420 such that a relative location between the upper body 430 and the lower body 420 may be moved from an opened location to a closed location. Here, the opened location is defined as a location at which the upper body 430 and the lower body 420 are spaced apart from each other such that the treatment space 412 communicates with the outside, and the closed location is defined as a location at which the upper body 430 and the lower body 420 contact each other such that the treatment space 412 is closed from the outside by the upper body 430 and the lower body 420. The body elevating member 450 elevates the lower body 420 to open or close the treatment space 412. The body elevating member 450 includes a plurality of elevation shafts 452 that connects the upper body 430 and the lower body 420. The elevation shafts 452 are located between an upper end of the lower body 420 and the upper body 430. The elevation shafts 452 are arranged along a periphery of an upper end of the lower body 420. The elevation shafts 452 may pass through the upper body 430 to be fixedly coupled to an upper end of the lower body 420. As the elevation shafts 452 is lifted or lowered, the height of the lower body 420 is changed and a distance between the upper body 430 and the lower body 420 may be adjusted.

The heating member 460 heats the treatment space 412. The heating member 460 heats the supercritical fluid supplied to the treatment space 412 to a critical temperature or higher to maintain a phase of the supercritical fluid. The heating member 460 may be buried and installed in at least one wall of the upper body 430 and the lower body 420. For example, the heating member 460 may be a heater 460 that receive electric power from the outside to generate heat.

The blocking member 480 prevents the supercritical fluid supplied from the lower supply port 474 from being directly supplied to a non-treatment surface of the substrate W. The blocking member 480 may include a blocking plate 482 and a support 484. The blocking plate 482 is located between the lower supply port 474 and the substrate support unit 440. The blocking plate 482 has a disk shape. The blocking plate 482 has a diameter that is smaller than an inner diameter of the lower body 420. When viewed from the top, the blocking plate 482 has a diameter by which both of the lower supply port 474 and the exhaustion port 426 are covered. For example, the blocking plate 482 may correspond to the diameter of the substrate W or have a larger diameter. The support 484 supports the blocking plate 482. A plurality of supports 484 are provided to be arranged along a circumferential direction of the blocking plate 482. The supports 484 are arranged to be spaced apart from each other by a specific interval.

The exhaustion unit 470 naturally exhausts the atmosphere of the treatment space 412. The process side-products generated in the treatment space 412 are exhausted through the exhaustion unit 470. Further, the exhaustion unit 470 may adjust a pressure of the treatment space 412 while exhausting the process side-products. The exhaustion unit 470 includes an exhaust line 472 and a pressure measuring member 474. The exhaust line 472 is connected to the exhaust port 426. An exhaust valve 476 installed in the exhaust line 472 may adjust an amount of exhaust gas of the treatment space 412. The pressure measuring member 474 is installed in the exhaust line 472 to measure a pressure of the exhaust line 472. The pressure measuring member 474 is located on an upstream side of the exhaust valve 476 with respect to an exhaustion direction.

The fluid supply unit 490 supplies a treatment fluid to the treatment space 412. The treatment space is supplied in a supercritical state by a supercritical temperature and a supercritical pressure. The fluid supply unit 490 includes an upper supply line 492 and a lower supply line 494. The upper supply line 492 is connected to the upper supply port 432. The treatment fluid is supplied to the treatment space 412 sequentially via the upper supply line 492 and the upper supply port 432. An upper valve 493 is installed in the upper supply line 492. The upper valve 493 opens and closes the upper supply line 492. The lower supply line 494 connects the upper supply line 492 and the lower supply port 422. The lower supply line 494 is branched from the upper supply line 492 and is connected to the lower supply port 422. That is, the treatment fluids supplied from the upper supply line 492 and the lower supply line 494 may be the same kind of fluid. The treatment fluid is supplied to the treatment space 412 sequentially via the lower supply line 494 and the lower supply port 422. A lower valve 494 is installed in the lower supply line 495. The lower valve 495 opens and closes the lower supply line 494.

The controller 600 controls the transfer unit 500. The controller 600 receives weight information of the substrate W from the transfer unit 500 and calculates the weight of the remained liquid on the substrate W. The controller 600 receives a pre-treatment weight of the substrate W measured before the substrate W is carried into the first processor chamber 260. Thereafter, the controller 600 receives a post-treatment weight of the substrate W liquid-treated in the first processor chamber 260. The controller 600 calculates the weight of the remained liquid on the substrate W based on a difference between the pre-treatment weight and the post-treatment weight of the substrate W. The post-treatment weight of the substrate W includes a pre-transfer weight and a post-transfer weight. The pre-transfer weight is a weight that is measured shortly before or immediately after the substrate W is carried out of the first process chamber 260, and the post-transfer weight is a weight that is measured shortly before the substrate W is carried into the second process chamber 280. The controller 600 may calculate the weight of the remained liquid on the substrate W based on the difference between the pre-treatment weight and the pre-transfer weight. The controller 600 may calculate an amount of lost liquid while the substrate W is transferred based on the difference between the pre-transfer weight and the post-transfer weight. If the calculated weight of the liquid and the calculated amount of lost liquid deviate from preset values, the controller 600 may carry the substrate W into the first process chamber 260 again to perform a substitution process again. Unlike this, if the calculated weight of the liquid and the calculated amount of lost liquid deviate from preset values, the controller 600 may generate an interlock in the first process chamber 260, in which the substrate W has been treated, and may send an alarm to an operator.

Next, a process of treating and transferring a substrate W by using the aforementioned substrate treating apparatus will be described.

Figure 8:
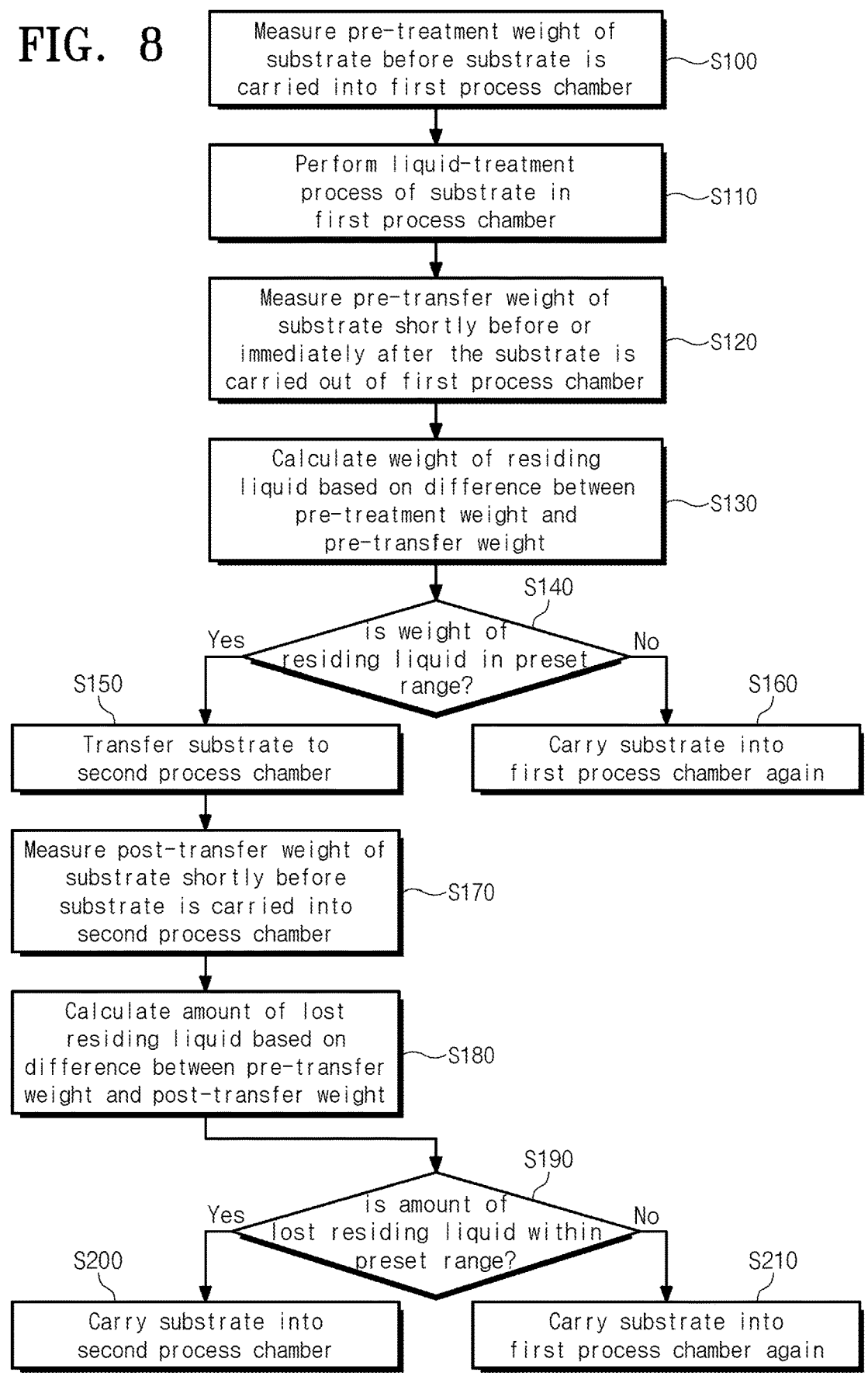
FIG. 8 is a flowchart illustrating a process of transferring a substrate by using a substrate treating system of FIG. 1.
Figure 9:
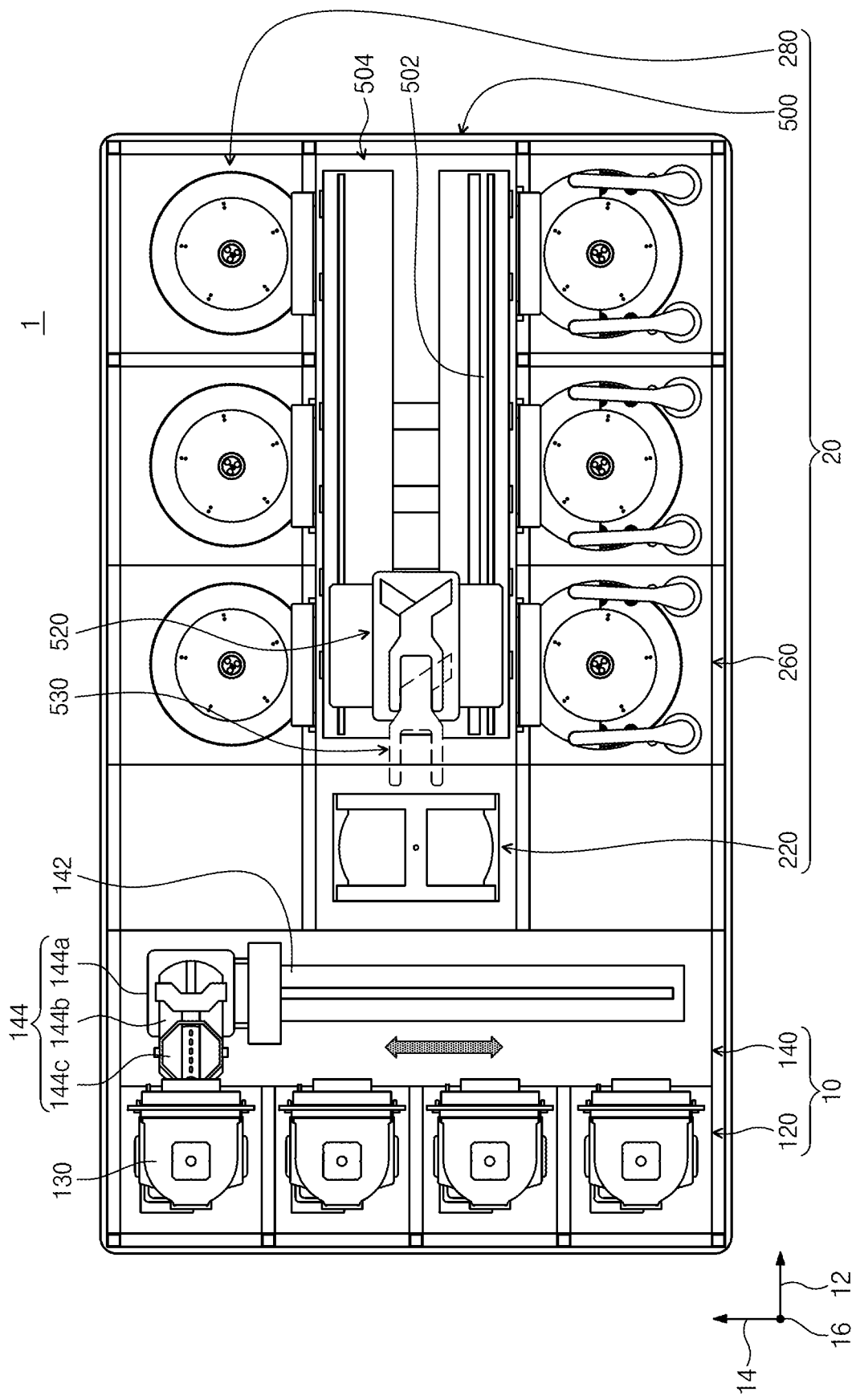
FIGS. 9 to 11 are views illustrating a process of transferring a substrate by a transfer robot of FIG. 1.
Figure 10:
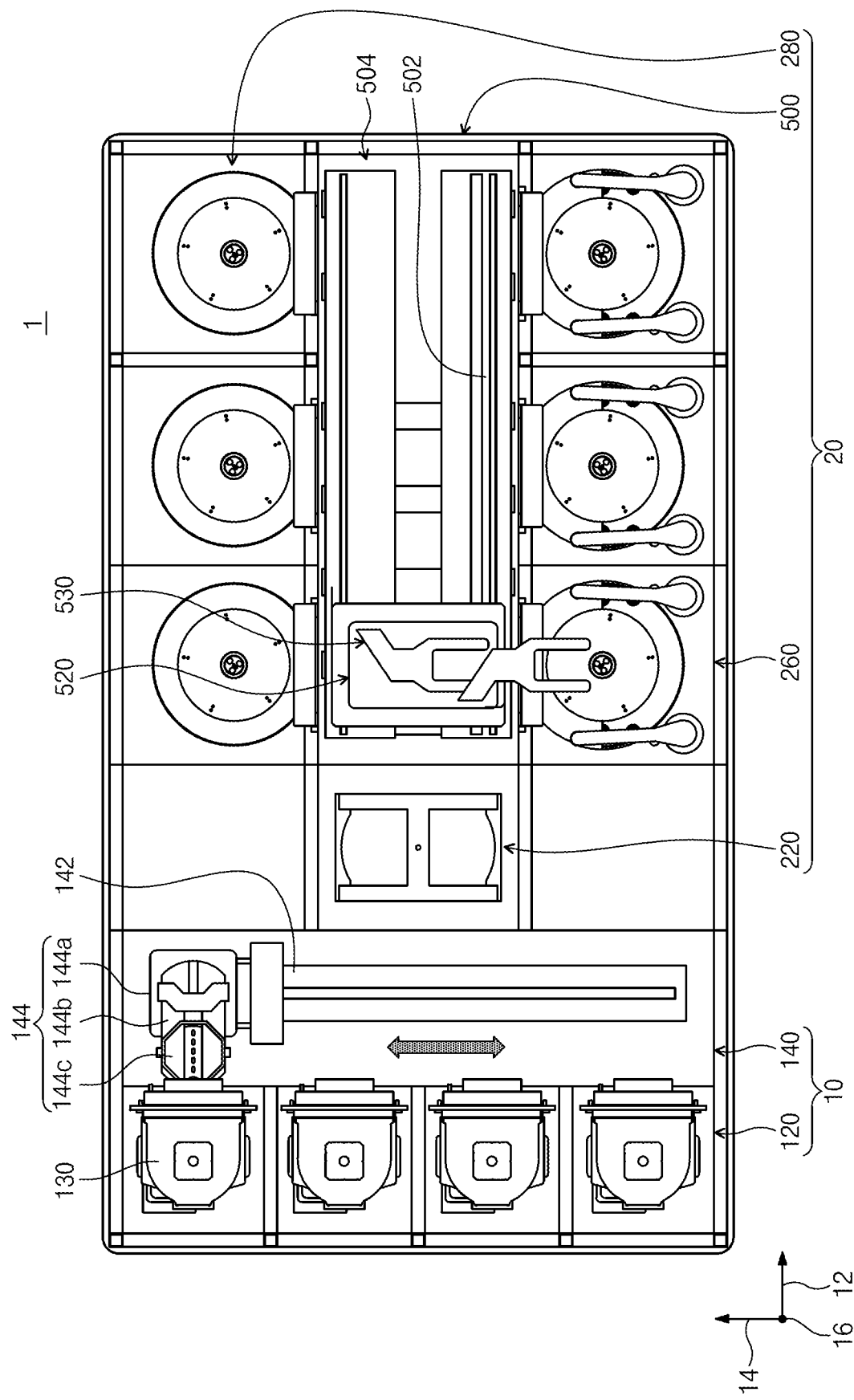
Figure 11:
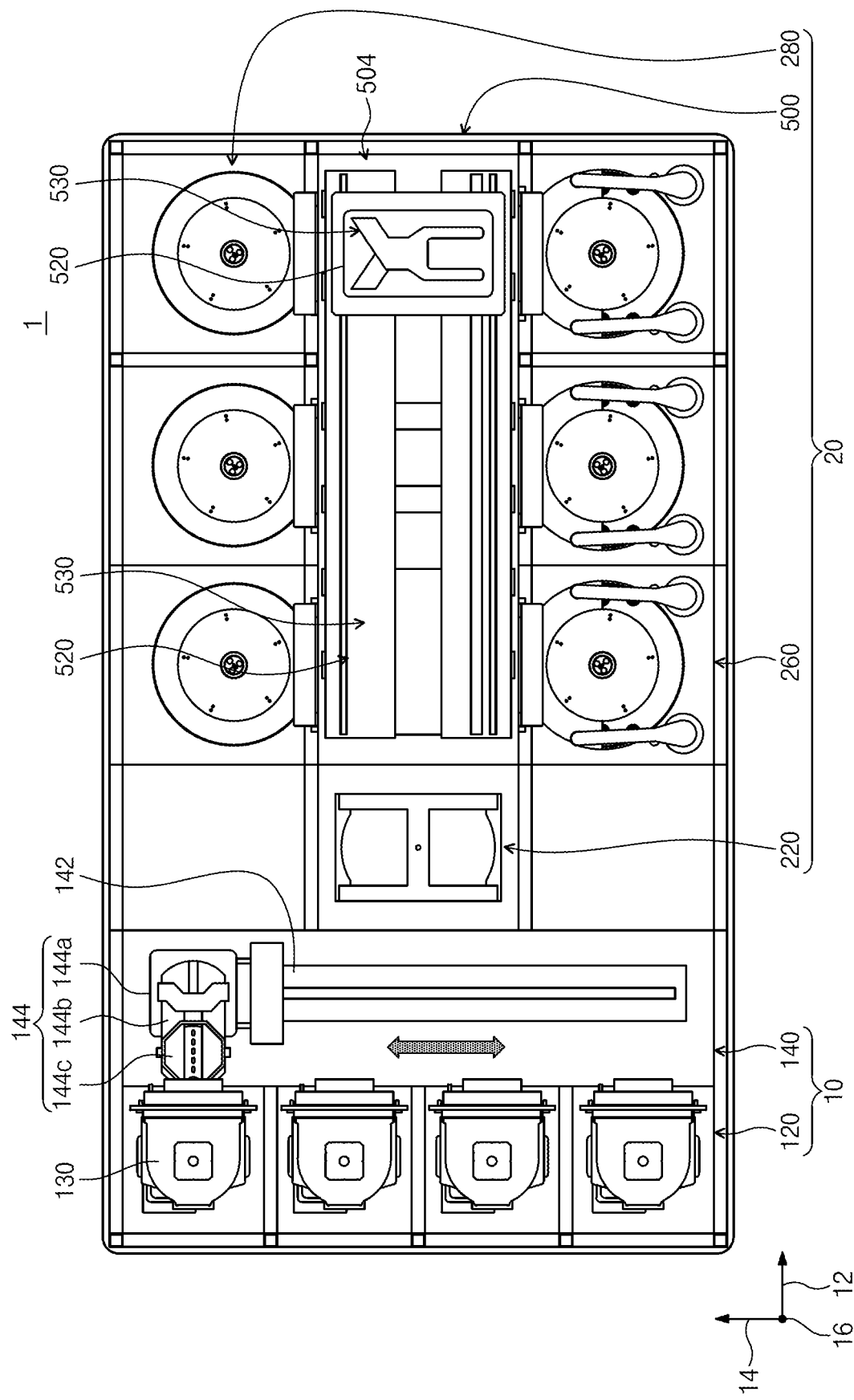

FIG. 8 is a flowchart illustrating a process of transferring a substrate by using a substrate treating system of FIG. 1. FIGS. 9 to 11 are views illustrating a process of transferring a substrate by a transfer unit of FIG. 1; Referring to FIGS. 8 to 11, the process of treating a substrate W includes a carrying-in operation, a liquid treating operation, a transfer operation, and a drying operation.

In the carrying-in operation S100, the transfer unit 500 transfers the substrate W temporarily preserved in the buffer unit 220 to the first process chamber 260. The transfer unit 500 carries the substrate W from the buffer unit 220, and measures the pre-treatment weight of the substrate W. If the pre-treatment weight is measured, the substrate W is carried into the first process chamber 260 and the liquid treating operation S110 is performed.

In the liquid treating operation S110, a chemical, a rinsing liquid, and an organic solvent are sequentially supplied onto the substrate W. If the liquid treating operation S110 is performed, the transfer unit 500 loads the substrate W in the spin head 342. The loaded substrate W is rotated by the spin head 342. The chemical cleans the substrate W, and the rinsing liquid rinses the chemical residing on the substrate W. The rinsing remained liquid on the substrate W is substituted by an organic solvent. If the liquid treating operation S110 is completed, the transfer operation is performed.

In the transfer operation, the transfer unit 500 lifts the substrate W and unloads the substrate W from the spin head 342. Before the substrate W is carried out of the first process chamber 260 by the transfer unit 500, the substrate W measures the pre-transfer weight of the substrate W (S120). A weight of the organic solvent residing on the substrate W is calculated based on the difference between the pre-treatment weight and the pre-transfer weight (S130).

If the calculated weight of the organic solvent deviates from a preset range, the substrate W is carried into the first process chamber 260 again (S160) and the organic solvent may be supplied. Further, the calculated weight of the organic solvent deviates from a preset range, an interlock is generated in the chamber 260, in which the liquid treating operation is performed, and a maintenance may be performed. For example, the preset range may be 6 g to 16 g.

Unlike this, the calculated weight of the organic solvent is within the preset range, the substrate W is carried out of the first process chamber 260 and is moved to a transfer space. The substrate W is transferred to the second process chamber 280 through the transfer space (S150). Shortly before the substrate W is carried into the second process chamber 280, the post-transfer weight of the substrate W is measured (S170). An amount of the lost organic solvent residing on the substrate W is calculated based on the difference between the pre-transfer weight and the post-transfer weight (S180).

If the calculated amount of the lost organic solvent deviates from a preset range, the substrate W is carried into the first process chamber 260 again (S210) and the organic solvent may be supplied. Further, the calculated amount of the lost organic solvent deviates from a preset range, an interlock is generated in the chamber 260, in which the liquid treating operation is performed, and a maintenance may be performed.

Unlike this, if the amount of the lost organic solvent is within the preset range, the substrate W is carried into the second process chamber 280 (S200) and a supercritical treatment process is performed.

According to the above-mentioned embodiment, the weight of the transferred substrate W may be measured and a proper amount of the liquid supplied to the substrate W may be detected. Accordingly, a process detect due to a lack or an excessive supply of the liquid may be prevented.

Further, because the weight of the substrate W is measured during the process, a state of the first process chamber 260, a seating state of the substrate W, and a damage to the transfer unit 500 may be detected.

Figure 12:
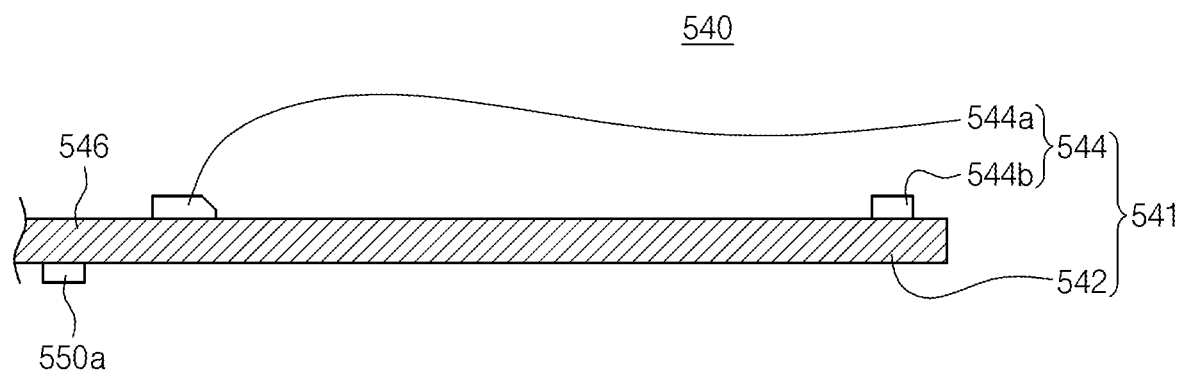
FIG. 12 is a sectional view illustrating a hand and a weight measuring unit of FIG. 4 according another embodiment.

It has been described in the above-mentioned embodiment that the weight measuring unit 550 is provided in the seating unit 542 of the hand 541 to measure a weight of the substrate W. However, as illustrated in FIG. 12, the weight measuring unit 550a may be installed in the arm 546. The weight measuring unit 550a may be a strain gauge that measures an electric resistance that is changed by a bending degree of the arm 546.

Figure 13:
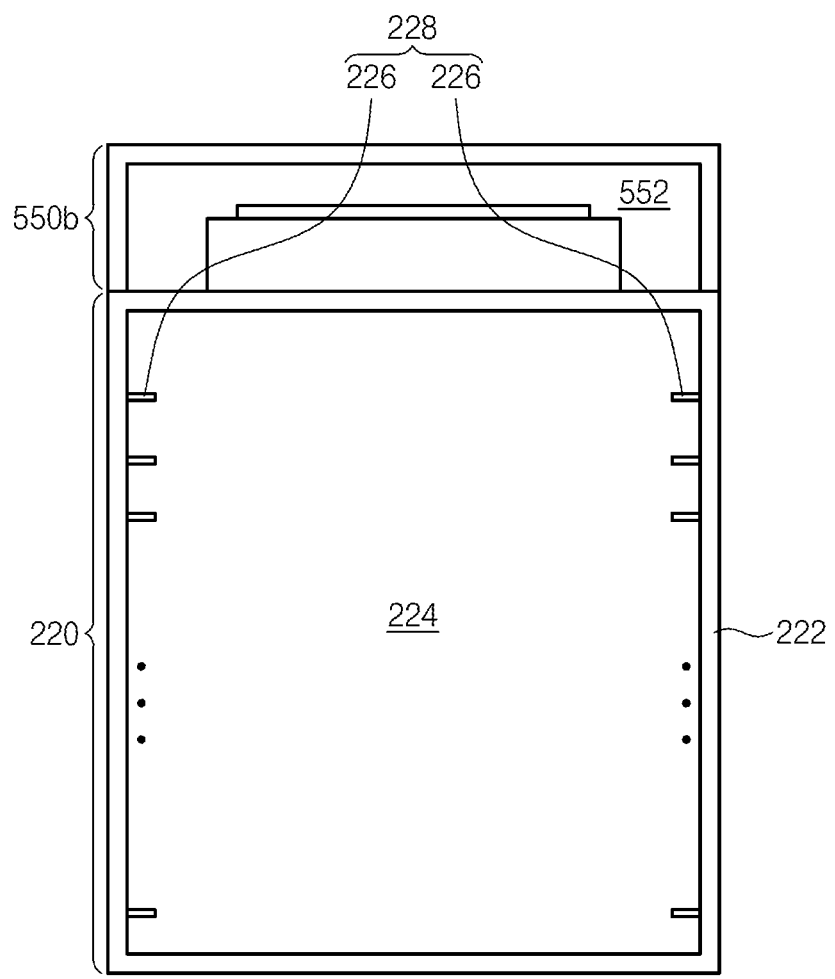
FIG. 13 is a sectional view illustrating another embodiment of the buffer unit of FIG. 2.

Further, it has been described that the weight measuring unit 550 is provided in the transfer member 540 to measure a weight of the substrate W. However, as illustrated in FIG. 13, the weight measuring unit 550b may be provided in the buffer unit 220. A weight measuring space 552 may be further provided in the buffer chamber 222. The weight measuring space 552 may be independent from the buffer space 224, and may be located above the buffer space 224.

Further, it has been described in the above-mentioned embodiment that the weight of the substrate W is measured while the substrate W is transferred between the liquid treatment chamber 260 and the drying chamber 280. However, the embodiment is not limited thereto, but the weight of the substrate W may be measured while the substrate W is transferred between liquid treatment chambers 260 that liquid-treat the substrate W with different kinds of liquids.

Further, it has been described in the embodiment that the weight of the organic solvent residing on the substrate W is calculated by measuring the weight of the substrate W. However, the inventive concept is not limited thereto, but the weights of liquids of different kinds from the organic solvent such as the chemical or the rinsing liquid may be calculated.

According the embodiment of the inventive concept, the transfer unit for transferring the substrate includes a weight measuring unit. Accordingly, the weight of the remained liquid on a substrate may be measured by measuring the weight of the substrate while the substrate is transferred.

Further, according to the embodiment of the inventive concept, a process defect may be prevented by measuring the weight of the remained liquid on the substrate.

Further, according to the embodiment of the inventive concept, a failure of the liquid treatment apparatus may be determined by measuring the weight of the remained liquid on the substrate.

What is claimed is:

1. A method for treating a substrate, the method comprising:
   liquid-treating the substrate in a liquid treatment chamber;
   drying the substrate in a drying chamber; and
   transferring the substrate from the liquid treatment chamber to the drying chamber by a carrier that comprises a hand that supports the substrate,
   wherein the transferring of the substrate comprises, while the substrate is seated on the hand, measuring a weight of a remaining liquid on the substrate by:
      measuring a pre-transfer weight of the substrate shortly before or immediately after the substrate is carried out of the liquid treatment chamber;
      measuring a post-transfer weight of the substrate shortly before the substrate is carried into the drying chamber; and
      calculating an amount of lost remained liquid on the substrate based on a difference between the pre-transfer weight and the post-transfer weight, wherein, if the difference deviates from a preset value, the substrate is carried into the liquid treatment chamber again and is liquid-treated while the substrate is seated on the hand.

2. The method of claim 1, wherein, in the transferring of the substrate, the weight of the remaining liquid is measured by the carrier that transfers the substrate from the liquid treatment chamber to the drying chamber.

3. The method of claim 2, further comprising:
before the liquid-treating of the substrate, carrying the substrate into the liquid treatment chamber by the carrier,
wherein the carrying of the substrate comprises measuring a pre-treatment weight of the substrate before the substrate is carried into the liquid treatment chamber,
wherein the transferring of the substrate comprises measuring a post-treatment weight of the substrate liquid-treated in the liquid treatment chamber, and
wherein a weight of the remained liquid is calculated based on a difference between the pre-treatment weight and the post-treatment weight.

4. The method of claim 2, wherein if the difference deviates from a preset value, a maintenance is performed.

5. The method of claim 2, wherein the liquid includes an isopropyl alcohol (IPA) liquid.

6. The method of claim 5, wherein the drying of the substrate comprises performing a supercritical treatment process in the drying chamber.

7. The method of claim 2, wherein the carrier transfers the substrate from the liquid treatment chamber to the drying chamber while the substrate is supported horizontally.

8. The method of claim 7, wherein the weight of the remaining liquid is measured by a load cell provided in the hand of the carrier.

9. A method for treating a substrate, the method comprising:
primarily treating the substrate in a first process chamber;
secondarily treating the substrate in a second process chamber; and
transferring the substrate from the first process chamber to the second process chamber by a carrier that comprises a hand that supports the substrate,
wherein the substrate is liquid-treated in the first process chamber,
wherein the transferring of the substrate comprises, while the substrate is seated on the hand, measuring a weight of a remaining liquid on the substrate by:
measuring a pre-transfer weight of the substrate shortly before or immediately after the substrate is carried out of the first process chamber;
measuring a post-transfer weight of the substrate shortly before the substrate is carried into the second process chamber; and
calculating an amount of lost remained liquid on the substrate based on a difference between the pre-transfer weight and the post-transfer weight,
wherein, if the difference deviates from a preset value, the substrate is carried into the first process chamber again and is liquid-treated while the substrate is seated on the hand.

10. The method of claim 9, wherein, in the transferring of the substrate, the weight of the remaining liquid is measured by a carrier that transfers the substrate from the first process chamber to the second process chamber.

11. The method of claim 10, wherein the liquid remained on the substrate is dried in the second process chamber.

12. The method of claim 11, wherein the liquid remained on the substrate is dried using a supercritical fluid.

13. The method of claim 10, wherein the liquid includes organic solvent.

* * * * *